(12) United States Patent
Wang et al.

(10) Patent No.: US 12,484,432 B2
(45) Date of Patent: Nov. 25, 2025

(54) METHOD FOR MANUFACTURING ORGANIC OPTOELECTRONIC DEVICE AND ORGANIC OPTOELECTRONIC DEVICE MANUFACTURED THEREBY

(71) Applicant: CHUNG ANG University Industry Academic Cooperation Foundation, Seoul (KR)

(72) Inventors: Dong Hwan Wang, Seoul (KR); Min Soo Kim, Seoul (KR); Woongsik Jang, Seoul (KR)

(73) Assignee: CHUNG ANG University Industry Academic Cooperation Foundation, Seoul (KR)

( * ) Notice: Subject to any disclaimer, the term of this patent is extended or adjusted under 35 U.S.C. 154(b) by 655 days.

(21) Appl. No.: 17/825,593

(22) Filed: May 26, 2022

(65) Prior Publication Data

US 2023/0389404 A1  Nov. 30, 2023
US 2025/0031561 A9  Jan. 23, 2025

(30) Foreign Application Priority Data

Jan. 6, 2022  (KR) .......................... 10-2022-0002073

(51) Int. Cl.
| | |
|---|---|
| H10K 71/18 | (2023.01) |
| H10K 30/15 | (2023.01) |
| H10K 30/20 | (2023.01) |
| H10K 85/10 | (2023.01) |
| H10K 85/60 | (2023.01) |

(52) U.S. Cl.
CPC ........... *H10K 71/18* (2023.02); *H10K 30/151* (2023.02); *H10K 30/20* (2023.02); *H10K 85/111* (2023.02); *H10K 85/113* (2023.02); *H10K 85/1135* (2023.02); *H10K 85/626* (2023.02); *H10K 85/655* (2023.02); *H10K 85/6576* (2023.02)

(58) Field of Classification Search
CPC .............................. H10K 30/20; H10K 71/18
See application file for complete search history.

(56) References Cited

U.S. PATENT DOCUMENTS

2010/0219401 A1*  9/2010  Bradley ................. H10K 71/18
257/E51.001

FOREIGN PATENT DOCUMENTS

| JP | 2012-84534 A | 4/2012 |
|---|---|---|
| JP | 2015-536577 A | 12/2015 |
| KR | 10-2020-0004769 A | 1/2020 |

OTHER PUBLICATIONS

Cheng, P., Li, G., Zhan, X. et al. Next-generation organic photovoltaics based on non-fullerene acceptors. Nature Photon 12, 131-142 (2018). (Year: 2018).*

(Continued)

*Primary Examiner* — Daniel P Shook
(74) *Attorney, Agent, or Firm* — Sughrue Mion, PLLC

(57) ABSTRACT

Disclosed is a method for manufacturing an organic optoelectronic device, the method including: coating a second layer composition on a mediator; and forming a second layer of thin film on a first layer by moving the second layer composition coated on the mediator onto the first layer, wherein the second layer composition contains a donor and an acceptor and the acceptor includes a non-fullerene compound.

10 Claims, 14 Drawing Sheets

(56) References Cited

OTHER PUBLICATIONS

Kim et al.; "Morphology Inversion of a Non-Fullerene Acceptor Via Adhesion Controlled Decal-Coating for Efficient Conversion and Detection in Organic Electronics"; Advanced Functional Materials; 2021; 11 pages.
Korean Patent Office, Communication issued Aug. 7, 2023 in copending Korean Application No. 10-2022-0002073.

* cited by examiner

[Fig. 1]

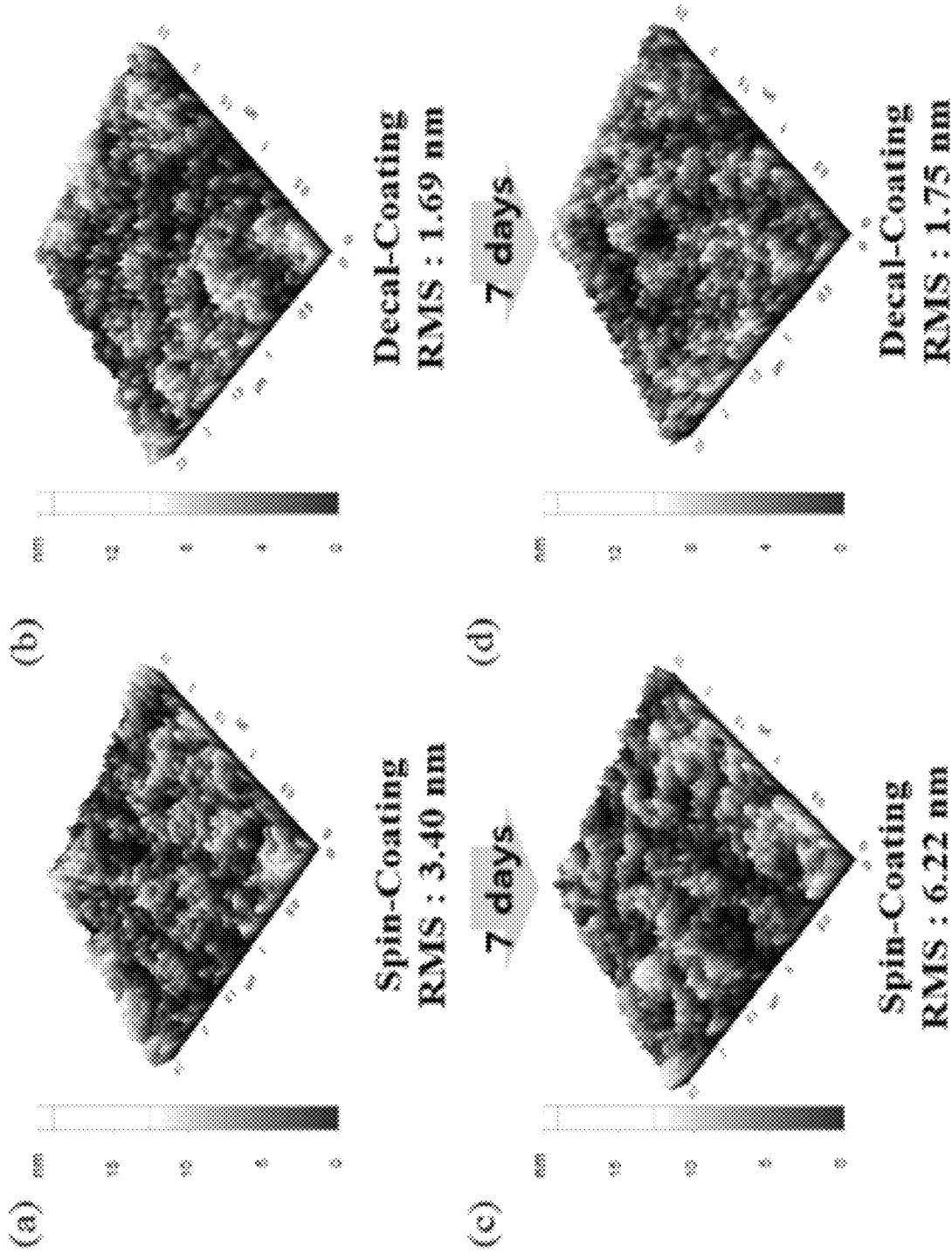
[Fig. 13]

METHOD FOR MANUFACTURING ORGANIC OPTOELECTRONIC DEVICE AND ORGANIC OPTOELECTRONIC DEVICE MANUFACTURED THEREBY

CROSS REFERENCE TO RELATED APPLICATIONS

This application claims priority from Korean Patent Application No. 10-2022-0002073, filed on Jan. 6, 2022.

BACKGROUND OF THE INVENTION

1. Field of the Invention

The present disclosure relates to a method for manufacturing an organic optoelectronic device and an organic optoelectronic device manufactured thereby.

2. Description of the Prior Art

Optoelectronic devices, such as photodiodes, phototransistors, and photovoltaic cells, are semiconductor devices that detect and sense optical energy to convert it into an electrical signal or convert electrical energy into an optical signal.

Organic optoelectronic devices are receiving much attention due to the advantages of having excellent light absorption characteristics of organic materials applied to photosensitive layers and being made into large-area devices through economical processes under low temperatures/low pressures.

Therefore, many studies have been reported on the improvement of device performance and the realization of large-area devices by developing a thin film forming process as well as materials.

In addition, studies have been conducted on the introduction of an infrared photosensitive non-fullerene acceptor in substitution for an existing fullerene acceptor, for a structure for improving photo-responsivity.

In the manufacturing of conventional organic thin film type optoelectronic devices, solution process-based spin coating is usually adopted to form a photosensitive layer. The above process corresponds to a representative example of a wet process in which a solution is directly coated onto a lower thin film, resulting in the solvent penetration into the lower thin film, causing damage to an adjacent thin film. Moreover, the wet process causes low stability and necessarily requires additional thermal treatment for removing a residual solvent after the process.

Especially, spin coating of a photosensitive layer with a heterojunction structure having mixed organic semiconductor materials, such as a donor and an acceptor, causes a deflection of a specific material on the surface of the lower thin film due to differences in density and surface energy between the donor and acceptor materials, and such a deflection acts as a disadvantageous factor for charge flow in a particular device structure.

Moreover, the existing thin film coating process causes instability especially when a photosensitive layer thin film employing a non-fullerene acceptor is formed on the lower thin film.

SUMMARY OF THE INVENTION

An aspect of the present disclosure is to provide a method for manufacturing an organic optoelectronic device with a photosensitive layer thin film employing a non-fullerene acceptor, wherein a formation process of the photosensitive layer thin film is optimized to improve reproducibility and stability of the formation thereof.

Furthermore, an aspect of the present disclosure is to provide a method for manufacturing an organic optoelectronic device with a photosensitive layer thin film employing a non-fullerene acceptor, wherein the photosensitive layer thin film is formed flat and interfacial resistance is minimized.

Furthermore, an aspect of the present disclosure is to provide a method for manufacturing an organic optoelectronic device with a photosensitive layer thin film employing a non-fullerene acceptor, wherein the charge flow is structurally improved through the morphology inversion of top and bottom portions of the photosensitive layer.

Furthermore, an aspect of the present disclosure is to provide a method for manufacturing an organic optoelectronic device with a photosensitive layer thin film employing a non-fullerene acceptor, wherein the charges formed by incident light are effectively separated/collected to improve photo-responsivity and the charge flow externally injected can be suppressed.

The above aspects of the present disclosure are attained as follows.

In accordance with an aspect of the present disclosure, there is provided a method for manufacturing an organic optoelectronic device, the method including: coating a second layer composition on a mediator; and forming a second layer of thin film on a first layer by moving the second layer composition coated on the mediator onto the first layer, wherein the second layer composition contains a donor and an acceptor and the acceptor includes a non-fullerene compound.

According to an embodiment of the present disclosure, the acceptor may include a non-fullerene compound containing a fluoro group.

According to an embodiment of the present disclosure, the donor may include a compound containing a fluoro group.

According to an embodiment of the present disclosure, the method may further include, after the forming of the second layer of thin film on the first layer, forming a third layer of thin film on the second layer.

According to an embodiment of the present disclosure, the first layer may contain poly(3,4-ethylenediocy-thiophene) doped with poly(styrenesulfonic acid (PEDOT:PSS).

According to an embodiment of the present disclosure, the acceptor of the second layer composition may be 2,2'-[[4,4,9,9-tetrakis(4-hexylphenyl)-4,9-dihydro-s-indaceno[1,2-b:5,6-b']dithiophene-2,7-diyl]bis[[4-[(2-ethylhexyl)oxy]-5,2-thiophenediyl]methylidyne(5,6-difluoro-3-oxo-1H-indene-2,1(3H)-diylidene)]]bis[propanedinitrile](IEICO-4F).

According to an embodiment of the present disclosure, the donor of the second layer composition may be poly([2,6'-4,8-di(5-ethylhexylthienyl)benzo[1,2-b;3,3-b]dithiophene]{3-fluoro-2[(2-ethylhexyl)carbonyl]thieno[3,4-b]thiophenediyl} (PTB7-Th).

According to an embodiment of the present disclosure, the third layer of thin film may contain titanium oxide ($TiO_x$, $1 \leq x \leq 10$).

According to an embodiment of the present disclosure, when a bottom portion and a top portion are separated in the second layer of thin film formed on the first layer, the bottom portion being in contact with the first layer and the top portion being not in contact with the first layer, the acceptor may be more abundant than the donor in the top portion and the donor may be more abundant than the acceptor in the bottom portion.

According to an embodiment of the present disclosure, the method may further include, before the coating of the second layer composition on the mediator, preparing a mediator containing a polyurethane acrylate oligomer.

According to an embodiment of the present disclosure, in the preparation of the mediator, a chemical agent containing a hydroxy, carboxy, or fluoro group may be further added to the mediator such that w<−1 is satisfied when the interfacial energy difference between the mediator and the second layer is denoted as A, the interfacial energy difference between the second layer and the first layer is denoted as B, the interfacial energy difference between the mediator and the first layer is denoted as C, and a value of (A−B)/C is denoted as w.

According to an embodiment of the present disclosure, the root mean square (RMS) roughness of the second layer of thin film formed on the first layer may be 0.1 to 3.0 nm.

In an aspect of the present disclosure, there is provided an optoelectronic device including: a first electrode; a first layer as a hole transport layer on the first electrode; a second layer as a photo-sensitive layer on the first electrode; a third layer as an electron transport layer on the second layer; and a second electrode on the third layer.

As set forth above, the present disclosure provides a method for manufacturing an organic optoelectronic device with a photosensitive layer thin film employing a non-fullerene acceptor, wherein reproducibility and stability of the formation of the photosensitive layer thin film can be improved by optimization the formation thereof.

Furthermore, the present disclosure provides a method for manufacturing an organic optoelectronic device with a photosensitive layer thin film employing a non-fullerene acceptor, wherein the photosensitive layer thin film can be formed flat and interfacial resistance can be minimized.

Furthermore, the present disclosure provides a method for manufacturing an organic optoelectronic device with a photosensitive layer thin film employing a non-fullerene acceptor, wherein the charge flow can be structurally improved through the morphology inversion of top and bottom portions of the photosensitive layer.

Furthermore, the present disclosure provides a method for manufacturing an organic optoelectronic device with a photosensitive layer thin film employing a non-fullerene acceptor, wherein the charges formed by incident light can be effectively separated/collected to improve photo-responsivity and the charge flow externally injected can be suppressed.

BRIEF DESCRIPTION OF THE DRAWINGS

FIG. 13 presents AFM images of photo-sensitive layer thin films formed by the example and comparative example of the present disclosure.

DETAILED DESCRIPTION OF THE EXEMPLARY EMBODIMENTS

Figure 1:
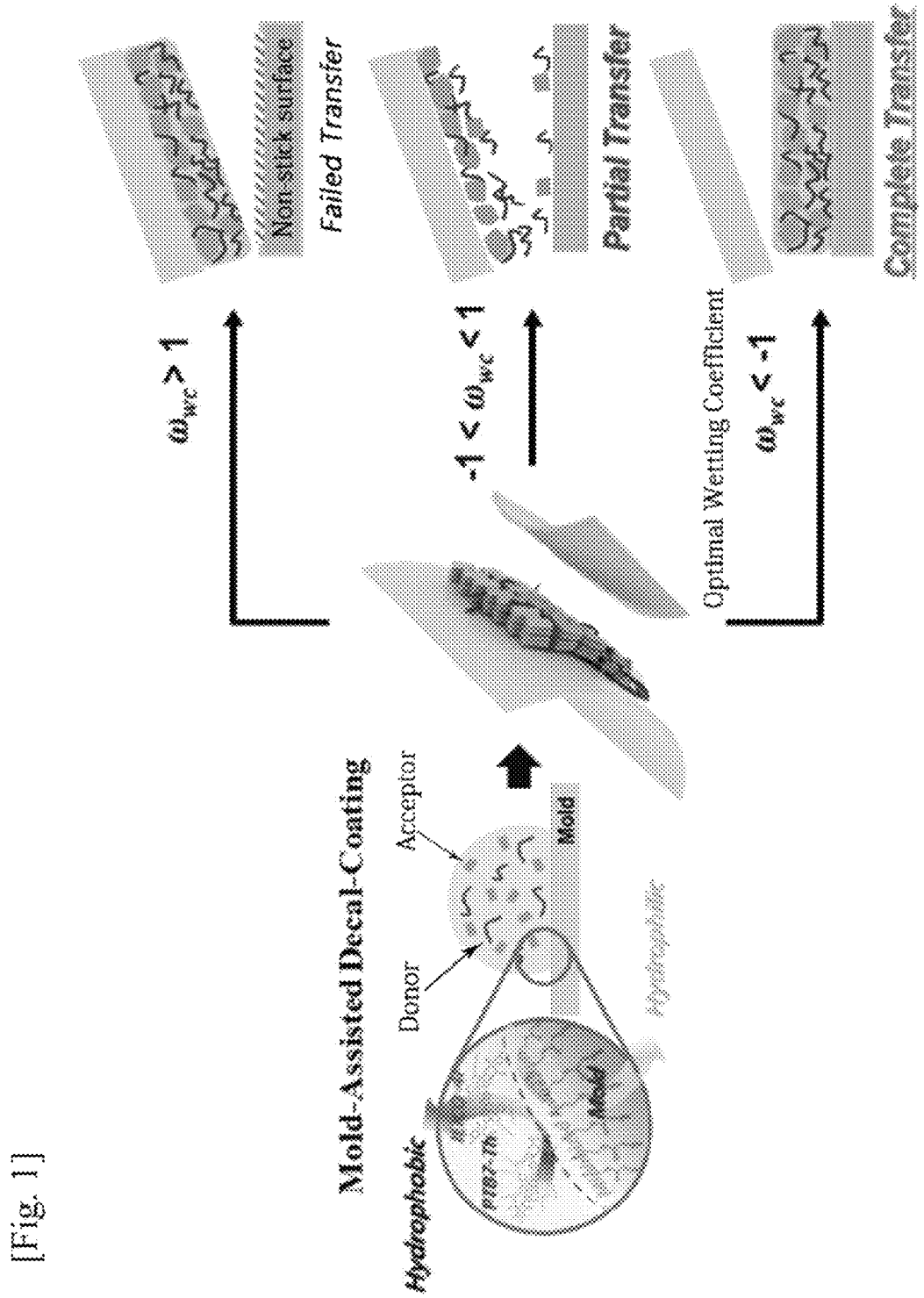
FIG. 1 is a process diagram of a photosensitive layer containing a non-fullerene acceptor according to an example of the present disclosure.

Hereinafter, the present disclosure will be described in more detail with reference to exemplary embodiments. However, these exemplary embodiments are for illustrative purposes only, and the scope of the present disclosure is not intended to be limited by these exemplary embodiments.

As used in the present disclosure, expressions such as "comprising", "including", and "containing" are to be understood as open-ended terms having the possibility of encompassing other exemplary embodiments, unless otherwise mentioned in the phrase or sentence containing such expressions.

As used herein, "preferable" and "preferably" refer to embodiments of the disclosure that may afford certain benefits, under certain circumstances. However, other embodiments may also be preferred, under the same or other circumstances. Furthermore, the recitation of one or more preferable embodiments does not imply that other embodiments are not useful, and is not intended to exclude other embodiments from the scope of the disclosure.

Respective steps may be changed from a mentioned order unless specifically mentioned in context. That is, respective steps may be performed in the same order as described, may be substantially simultaneously performed, or may be performed in reverse order.

Herein, when one member is disposed "on" another member throughout the present specification, this encompasses not only a case where the one member is brought into contact with another member, but also a case where still another member is present between the two members.

The present disclosure is directed to semiconductor devices, such as a transistor, a photodetector, an image sensor, a light emitting diode, a memory device, a display, and a solar cell, and especially to an organic optoelectronic device, wherein in a method for manufacturing an organic optoelectronic device, a so-called "dry decal process" is introduced to stably form a photosensitive layer of thin film employing a non-fullerene acceptor.

The "dry decal process" refers to a process in which a layer of thin film to be transferred to a desired composition layer is formed by using a mediator in a dry condition, and the dry decal process can solve stability and reproducibility problems occurring in the formation of a photosensitive layer thin film employing a non-fullerene acceptor and block other problems that may occur in a wet condition.

In the "dry decal process" of the present disclosure, the photosensitive layer thin film is formed and dried to adhere onto the mediator, and then the corresponding thin film is uniformly separated from the mediator, thereby allowing the transfer to a lower layer in a dry condition. Therefore, unlike an existing process of performing the transfer to a lower layer in a wet condition, the dry decal process can significantly solve the problems of solvent penetration into the lower layer and interlayer mixing.

A photosensitive layer employing a non-fullerene acceptor formed through the "dry decal process" of the present disclosure can effectively separate/collect charges formed by incident light to improve photo-responsivity and suppress the charge flow externally injected.

In the present disclosure, an organic optoelectronic device with significantly enhanced performance was successfully manufactured by stably forming an organic-material photosensitive layer thin film using both a photo-responsive polymer organic semiconductor and a non-fullerene acceptor, through the "dry decal process".

In the present disclosure, excellent process reproducibility was ensured by analyzing surface energies between materials, and the formation of an inversion, advantageous for charge flow, of top and bottom portions of a structure of a donor and an acceptor containing a non-fullerene compound, was confirmed through qualitative analysis.

It was also confirmed that the photosensitive layer employing a non-fullerene acceptor formed through the "dry decal process" had a flat thin film form.

The improvement in photo-conversion characteristics, the improvement in photo-responsivity, the improvement in suppression characteristics of dark current by charge injection, and the improvement in driving stability in the atmosphere were confirmed through optical/electric analysis of an organic optoelectronic device employing a non-fullerene acceptor.

Hereinafter, the process will be described.

A method for manufacturing an organic optoelectronic device according to an embodiment of the present disclosure includes coating a second layer composition on a mediator.

The second layer composition of the present disclosure may be a photosensitive layer with a heterojunction structure having mixed organic semiconductor materials for a donor and an acceptor.

The acceptor includes a non-fullerene compound.

As an example, the non-fullerene compound may be at least one selected from IDTBR, o-IDTBR, eh-IDTBR, IDFBR, ITIC, ITIC-2F, ITIC-4F, ITIC-M, ITIC-Th, IEICO, IEICO-4F, IEICO-4Cl, IDIC, IFBR, ITCC, and IEIC, but the dry decal process of the present disclosure may be a process that is optimized according to the calculation of interfacial energy when the photosensitive layer employs a non-fullerene compound as an acceptor.

As a more preferable example, the acceptor may include a non-fullerene compound containing a fluoro group. The dry decal process of the present disclosure may be an optimized process in the formation of a photosensitive layer containing a non-fullerene compound containing a fluoro group.

As a most preferable example, the acceptor of the second layer composition may be 2,2'-[[4,4,9,9-Tetrakis(4-hexylphenyl)-4,9-dihydro-s-indaceno[1,2-b:5,6-b']dithiophene-2,7-diyl]bis[[4-[(2-ethylhexyl)oxy]-5,2-thiophenediyl]methylidyne(5,6-difluoro-3-oxo-1H-indene-2,1(3H)-diylidene)]]bis[propanedinitrile] (IEICO-4F). The dry decal process of the present disclosure may be an optimized process in the formation of a photosensitive layer containing, especially, IEICO-4F, as an acceptor.

As an example, the donor may be at least one of poly[(2,6-(4,8-bis(5-(2-ethylhexyl)thiophen-2-yl)-benzo[1,2-b:4,5-b']dithiophene))-alt-(5,5-(1',3'-di-2-thienyl-5',7'-bis(2-ethylhexyl)benzo[1',2'-c:4',5'-c']dithiophene-4,8-dione))] (PB-DB-T), poly[N-9'-heptadecanyl-2,7-carbazole-alt-5,5-(4',7'-di-2-thienyl-2',1',3'-benzothiadiazole)] (PCDTBT), poly[[4,8-bis[(2-ethylhexyl)oxy]benzo[1,2-b:4,5-b']dithiophene-2,6-diyl][3-fluoro-2-[(2-ethylhexyl)carbonyl]thieno[3,4-b]thiophenediyl]] (PTB-7), and poly[4,8-bis(5-(2-ethylhexyl)thiophen-2-yl)benzo[1,2-b;4,5-b']dithiophene-2,6-diyl-alt-(4-(2-ethylhexyl)-3-fluorothieno[3,4-b]thiophene-)-2-carboxylate-2-6-diyl)] (PTB7-Th), but is necessarily limited thereto.

As a more preferable example, the donor may include a compound containing a fluoro group. The dry decal process of the present disclosure may be an optimized process in the formation of a photosensitive layer with a heterojunction structure in which an acceptor including non-fullerene containing a fluoro group is mixed with a donor, a compound containing a fluoro group.

As a most preferable example, the donor of the second layer composition may be poly([2,6'-4,8-di(5-ethylhexylthienyl)benzo[1,2-b;3,3-b]dithiophene]{3-fluoro-2[(2-ethylhexyl)carbonyl]thieno[3,4-b]thiophenediyl} (PTB7-Th).

The compound shows high photo-conversion efficiency due to the comparatively low bandgap energy and thus has been widely used in a field of optoelectronic devices. However, the compound has several problems in terms of the application to optoelectronic devices, and thus preceding studies therefor are few and the performance thereof is rather degraded compared with other materials. The problems are as follows. First, the compound exhibits a comparatively high dark current due to a relatively high possibility of charge injection compared with other materials (P3HT, PCDTBT, etc.) on the highest occupied molecular orbital (HOMO) level. Second, the compound is amorphous polymer and thus shows comparatively low stability due to the self-aggregation occurring by heat or external force. In the present disclosure, optimal performance and stability were achieved by mixing with a non-fullerene material designed to solve the problems. The compound has excellent external quanta and has an energy level at which the compound can improve the responsivity of an organic sensing material by combining with a non-fullerene compound. The non-fullerene compound is effectively packed by the compound and thus is not easily degraded by heat and bias stress. In addition, the response speed in optoelectronic devices is faster since electrons are promptly extracted from a donor of the compound to an acceptor of the non-fullerene compound.

The stable formation of a photosensitive layer employing both the acceptor and the donor through the dry decal process of the present disclosure can be confirmed.

The second layer composition may further contain at least one additive selected from 1,8-diiodooctane (DIO), 1-chloronaphthalene (1-CN), diphenylether (DPE), octane dithiol, and tetrabromothiophene, but the additive is not particularly limited thereto.

According to an embodiment, the manufacturing method may further include, before the coating of the second layer composition on the mediator, preparing a mediator containing a polyurethane acrylate oligomer.

Then, the manufacturing method includes forming a second layer of thin film on a first layer by moving the second layer composition, coated on the mediator, onto the first layer.

In the method for manufacturing an organic optoelectronic device according to an embodiment of the present disclosure, an initial thin film can be turned upside and transferred by such a process, thereby structurally improving charge flow.

According to a more preferable embodiment to improve the charge flow, when a bottom portion and a top portion are separated in the second layer of thin film formed on the first layer, the bottom portion being in contact with the first layer and the top portion being not in contact with the first layer, the acceptor may be more abundant than the donor in the top portion and the donor may be more abundant than the acceptor in the bottom portion.

Since the interfacial energy of the donor of the present disclosure is lower than the electron energy of the acceptor containing non-fullerene, spin coating directly on the first layer results in a second layer of thin film in which a hydrophobic donor is abundant in the top portion and an acceptor is abundant in the bottom portion. However, the dry decal process of the present disclosure can control the second layer of thin film to have an acceptor abundant in the top portion therein through a morphology inversion system, leading to a favorable charge collection in a structure with anode/hole transport layer (HTL)/active layer/electron transport layer (ETL)/cathode.

As an example, when the second layer composition is coated to the mediator, a solution containing the second layer composition may be spin-coated on the mediator at 1000 to 2000 rpm for 40 to 80 s.

As an example, the manufacturing method may further include, after the forming of the second layer of thin film on the first layer, performing heat treatment at 80 to 120° C.

As an example, the first layer may be a host transport layer, and a compound contained in the hole transport layer may include, but not limited thereto, poly(3,4-ethylenediocy-thiophene) doped with poly(styrenesulfonic acid) (PEDOT:PSS) as an optimized example in the present manufacturing method. The use of the compound enables a solution process and a low-temperature (100,000° C. or lower) process in the manufacture of photosensors, and the compound has an appropriate highest occupied molecular orbital (HOMO) energy level of −5.0 eV, contributing to photocurrent amplification and dark current suppression.

According to an embodiment, in the preparation of the mediator, a chemical agent containing a hydroxy, carboxy, or fluoro group may be further added to the mediator, wetting coefficient (w), such that w<−1 is satisfied when the interfacial energy difference between the mediator and the second layer is denoted as A, the interfacial energy difference between the second layer and the first layer is denoted as B, the interfacial energy difference between the mediator and the first layer is denoted as C, and a value of (A−B)/C is denoted as w.

The present inventors identified that if 1<w or −1<w<1, the photosensitive layer composition remained on the mediator to result in no transfer or partial transfer onto the first layer, but if w<−1, the second layer containing the photosensitive layer composition was completely transferred onto the first layer and morphology inversion was successfully achieved. Therefore, the mediator is controlled by adding a chemical agent containing a hydroxy, carboxy, or fluoro group to the mediator, such that w<−1 is satisfied, according to the first layer and second layer compositions, and thus a second layer containing a non-fullerene compound could be successfully formed on the first layer (FIG. 1).

As a more preferable example, the interfacial energy difference, A, between the intermediator and the second layer containing a non-fullerene compound as an acceptor may be 2 to 5 mJ/m$^2$ or 3 to 4 mJ/m$^2$.

As more preferable example, the interfacial energy difference, B, between the second layer containing a non-fullerene compound as an acceptor and the first layer may be 9 to 13 mJ/m$^2$ or 10 to 12 mJ/m$^2$.

As a more preferable example, the interfacial energy difference, C, between the intermediator and the first layer may be 3 to 6 mJ/m$^2$ or 4 to 5 mJ/m$^2$.

Herein, the interfacial energies of the first layer, the second layer, and the intermediator were determined by the Owen-Wendt method.

In an embodiment, the root mean square (RMS) roughness of the second layer of thin film formed on the first layer may be 0.1 to 3.0 nm or 1.0 to 2.0 nm. The present inventors, as a result of performing AFM analysis by the dry decal process of the present disclosure, identified that the second layer of thin film thus formed was controlled to have an RMS value in the above range. The non-fullerene compounds are likely to move around and change the morphology over time due to a low glass transition temperature ($T_g$), but these problems can be overcome by minimizing the solvent penetration into the first layer based on the dry decal coating process of the present disclosure and forming a chemically stable morphology compared with that of the spin-coating process. Also, the smoother surface obtained by this process can attain better adhesion and improved interactions between the respective layers.

Herein, the root mean square (RMS) roughness was determined by atomic force microscope (AFM).

In an embodiment, the method may further include, after the forming of the second layer of thin film on the first layer, forming a third layer of thin film on the second layer.

For example, the third layer is an electron transport layer, and an optimized example of the compound contained therein may include, but is not limited to, titanium oxide ($TiO_x$, $1 \leq x \leq 10$).

An organic optoelectronic device according to an embodiment of the present disclosure includes: a first electrode; a first layer as a hole transport layer on the first electrode; a second layer as a photo-sensitive layer on the first electrode; a third layer as an electron transport layer on the second layer; and a second electrode on the third layer.

The first electrode and the second electrode are provided to face each other. The first electrode may be a cathode. The second electrode may be an anode.

The first electrode or the second electrode each may contain fluorine-containing tin oxide, indium-containing tin oxide, aluminum-containing zinc oxide, indium-containing zinc oxide, or a mixture thereof, or gold (Au), silver (Ag), platinum (Pt), palladium (Pd), copper (Cu), aluminum (Al), carbon (C), cobalt sulfide (CoS), copper sulfide (CuS), nickel oxide (NiO), or a mixture thereof, but the compound is not particularly limited thereto. More preferably, the first electrode may contain indium tin oxide (ITO), and the second electrode may contain aluminum, but are not limited thereto.

The first layer as a hole transport layer on the first electrode is as described above.

The second layer as a photosensitive layer on the first layer is as described above.

The third layer as an electron transport layer on the second layer is as described above.

Hereinafter, the present disclosure will be described in detail through examples and test examples. However, the following examples and test examples are merely for illustrating the present disclosure, and are not intended to limit the scope of the present disclosure.

Preparation of Mediator

To satisfy w<−1, a polyurethane acrylate mixture was synthesized using 1.5 g of a urethane diacrylate oligomer, 0.5 g of HCPK, and 3 g of hydroxyethyl acrylate, and sonicated at 30° C. for 20 min.

The mixture was poured onto a silicon wafer master, and rubbed slightly after being covered with polycarbonate (PC) film, and then the prepared mediator was cured by exposure to UV light for 10 min.

Manufacturing of Optoelectronic Device

Example

The glass/ITO substrate was cleaned by sonication with de-ionized water, acetone, and isopropanol (IPA) for 20 min, and then blown with nitrogen gas to remove a residual cleaning solvent. For hydrophilic surface modification, the glass/ITO substrate was treated with UV-ozone for 15 min.

For the formation of a PEDOT:PSS layer, spin-coating was performed at 5000 rpm for 40 s and then thermal treatment was performed at 140° C. for 10 min.

For the formation of a photosensitive layer, a mixture obtained by adding a PTB7-Th:IEICO-4F solution of a weight ratio of 2:3 (a concentration of 20 mg mL-1) to chlorobenzene with 1-chloronaphthalene (4 vol %) was spin-coated onto the prepared mediator at 1500 rpm for 60 s. Subsequently, the spin-coated composition was transferred to the PEDOT:PSS layer, followed by thermal treatment at 100° C. for 10 min to eliminate residual solvents.

Thereafter, $TiO_x$ (25 mmol L-1 in IPA) was spin-coated at 5000 rpm for 40 s in the atmosphere to form an electron transport layer with a thickness of approximately 10 nm.

Finally, an Al cathode with a thickness of 100 nm was subjected to thermal evaporation onto the device by a thermal evaporator using a shadow mask at $4.0 \times 10^{-6}$ Torr.

Comparative Example

A device was manufactured by the same method as in the example except that in the step of forming the photosensitive layer, the mixture of obtained by adding a PTB7-Th:IEICO-4F solution of a weight ratio of 2:3 (a concentration of 20 mg mL-1) to chlorobenzene with 1-chloronaphthalene (4 vol %) was spin-coated directly onto the PEDOT:PSS layer.

Test Example

Figure 2:
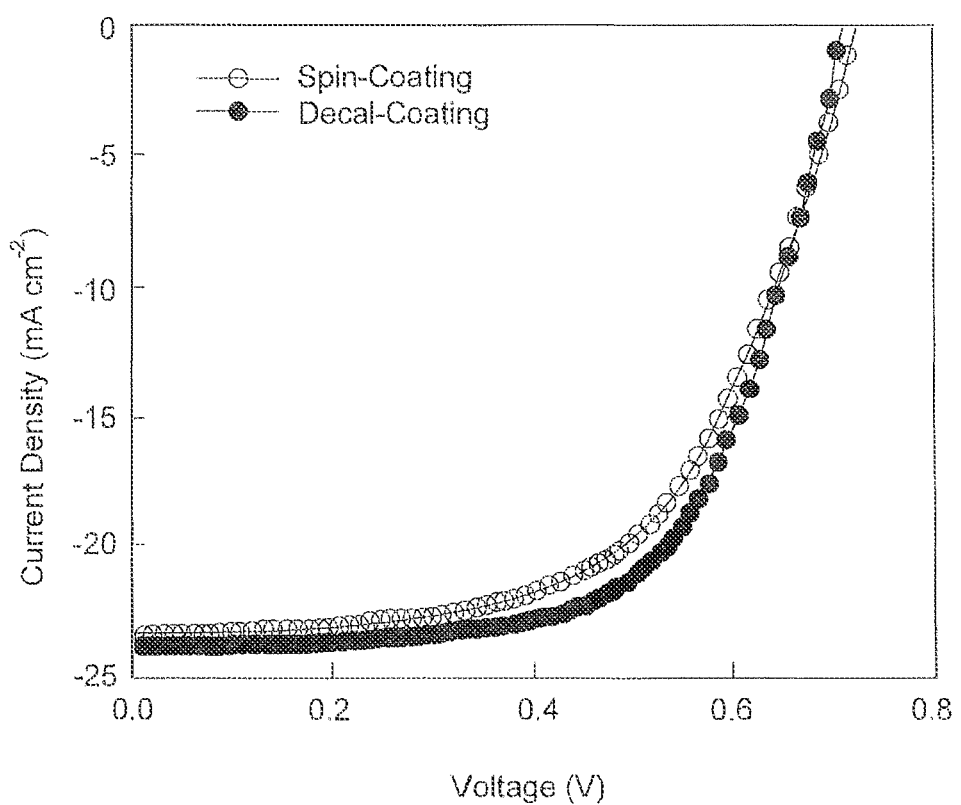
FIG. 2 is a graph of photocurrent-voltage curves in organic optoelectronic devices according to the example and comparative example of the present disclosure.

Referring to FIG. 2, the J-V characteristics, under the illumination at AM 1.5 G 100 mW cm², of the optoelectronic device of the example were improved compared with the comparative example.

Figure 3:
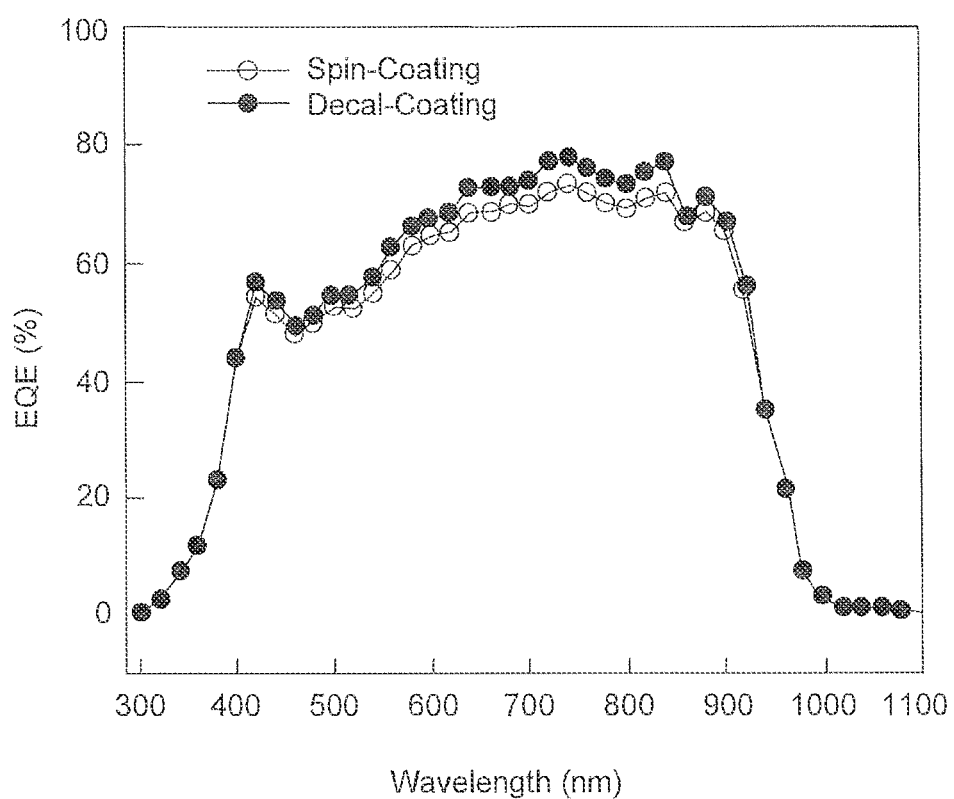
FIG. 3 is a graph showing external quantum efficiency in organic optoelectronic devices according to the example and comparative example of the present disclosure.

Referring to FIG. 3, the JSC value, in the external quantum efficiency (EQE) spectrum, of the optoelectronic device of the example was improved compared with the comparative example.

Figure 4:
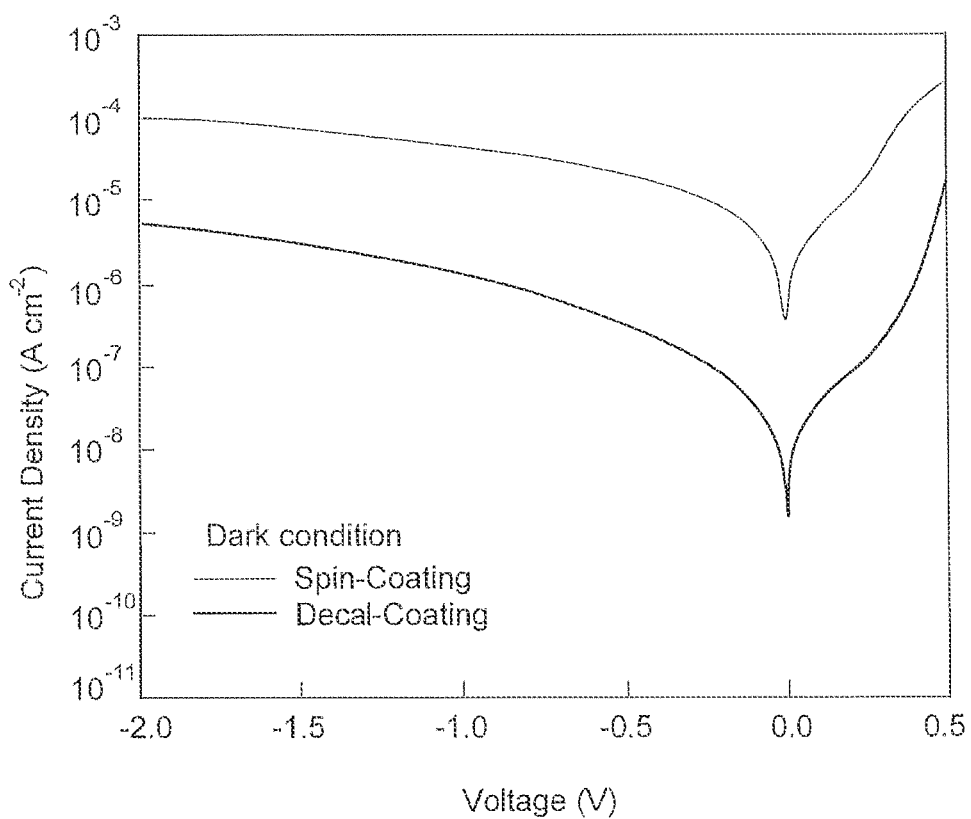
FIG. 4 is a graph of dark current-voltage curves in organic optoelectronic devices according to the example and comparative example of the present disclosure.

Referring to FIG. 4, the dark current, in an applied bias of −0.5 V, of the optoelectronic device of the example was reduced compared with the comparative example.

Figure 5:
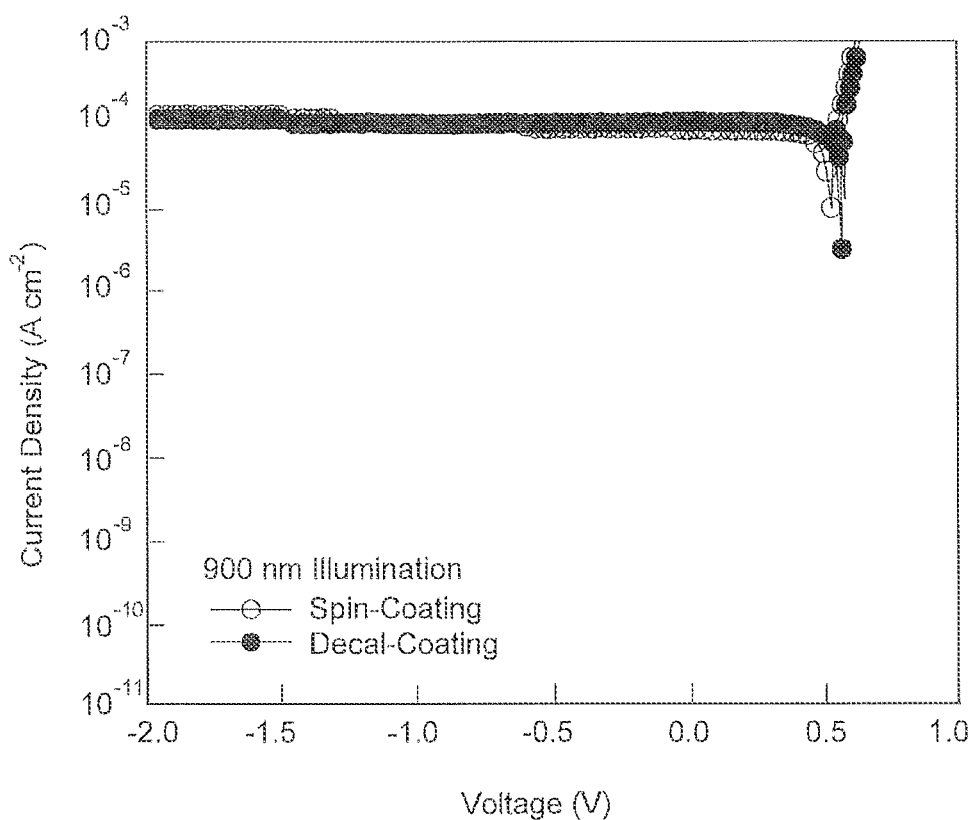
FIG. 5 is a graph of photocurrent density at a wavelength of 900 nm in organic optoelectronic devices according to the example and comparative example of the present disclosure.

Referring to FIG. 5, the photocurrent density, at a wavelength of 900 nm, of the optoelectronic device of the example was improved compared with the comparative example.

Figure 6:
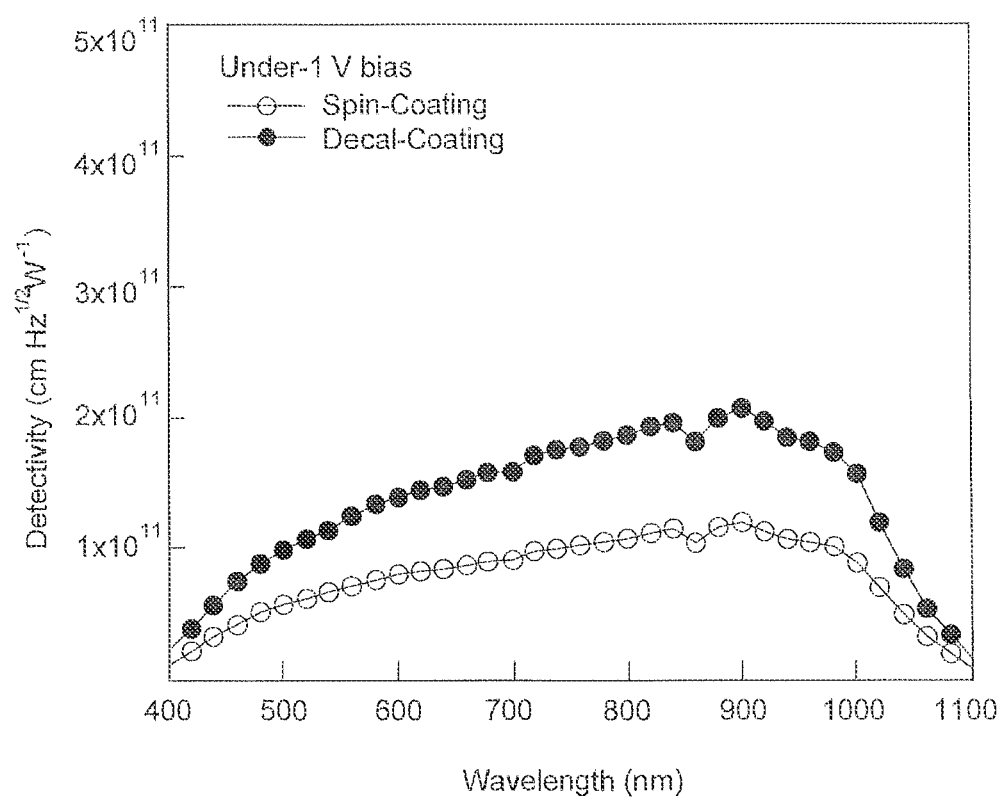
FIG. 6 is a graph showing photo-detectivity at an applied voltage of −1 V in organic optoelectronic devices according to the example and comparative example of the present disclosure.
Figure 7:
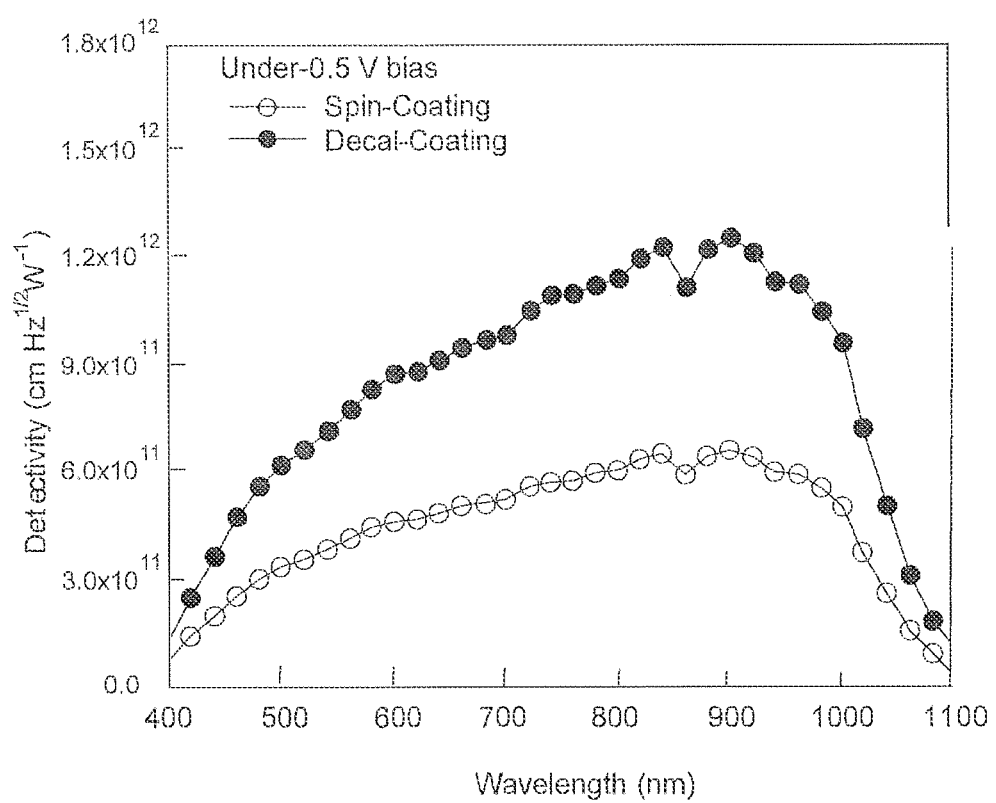
FIG. 7 is a graph showing photo-detectivity at an applied voltage of −0.5 V in organic optoelectronic devices according to the example and comparative example of the present disclosure.

Referring to FIGS. 6 and 7, the photo-detectivity, in applied voltages of −1 V and −0.5 V. of the optoelectronic device of the example was improved compared with the comparative example.

Figure 8A:
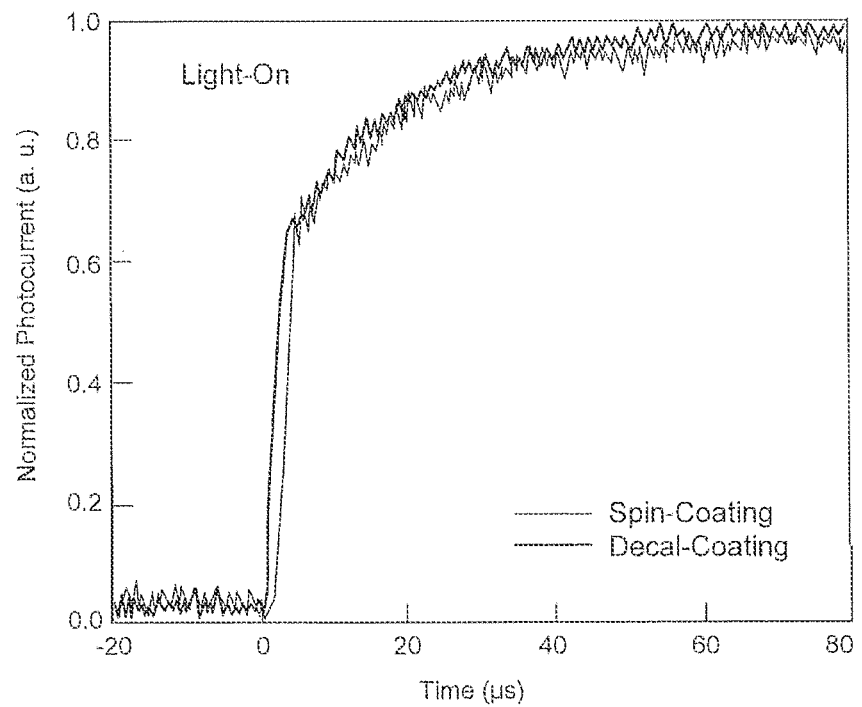
FIGS. 8A and 8B present graphs showing the response speed characteristics of photo-response performance index in organic optoelectronic devices according to the example and comparative example of the present disclosure.
Figure 8B:
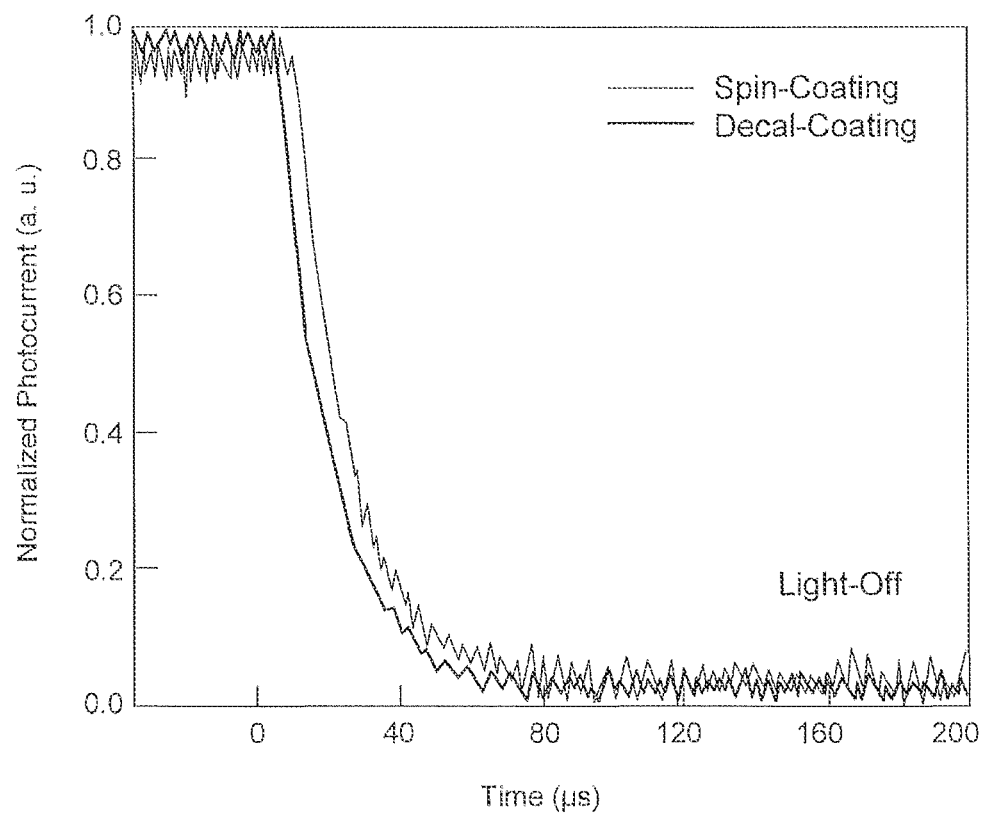

Referring to FIG. 8, the optoelectronic device of the example showed a faster photo-response time compared with the comparative example when the light is turned on and off.

Figure 9:
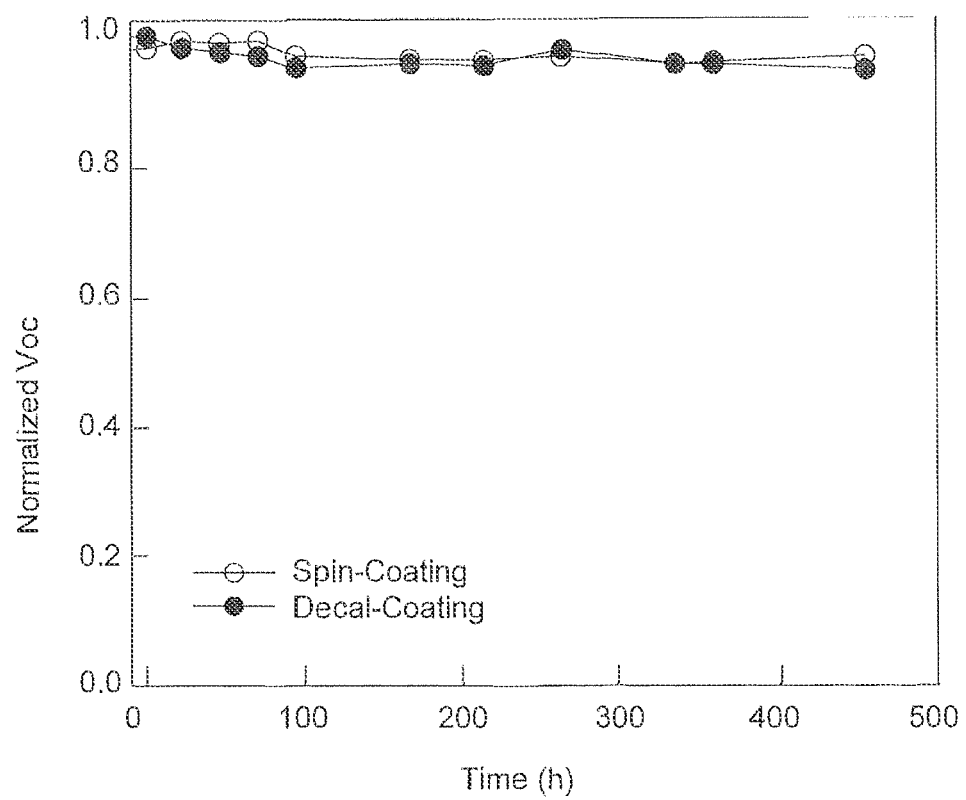
FIG. 9 is a graph showing open-circuit voltage with respect to driving stability for 500 h in the atmosphere in organic optoelectronic devices according to the example and comparative example of the present disclosure.
Figure 10:
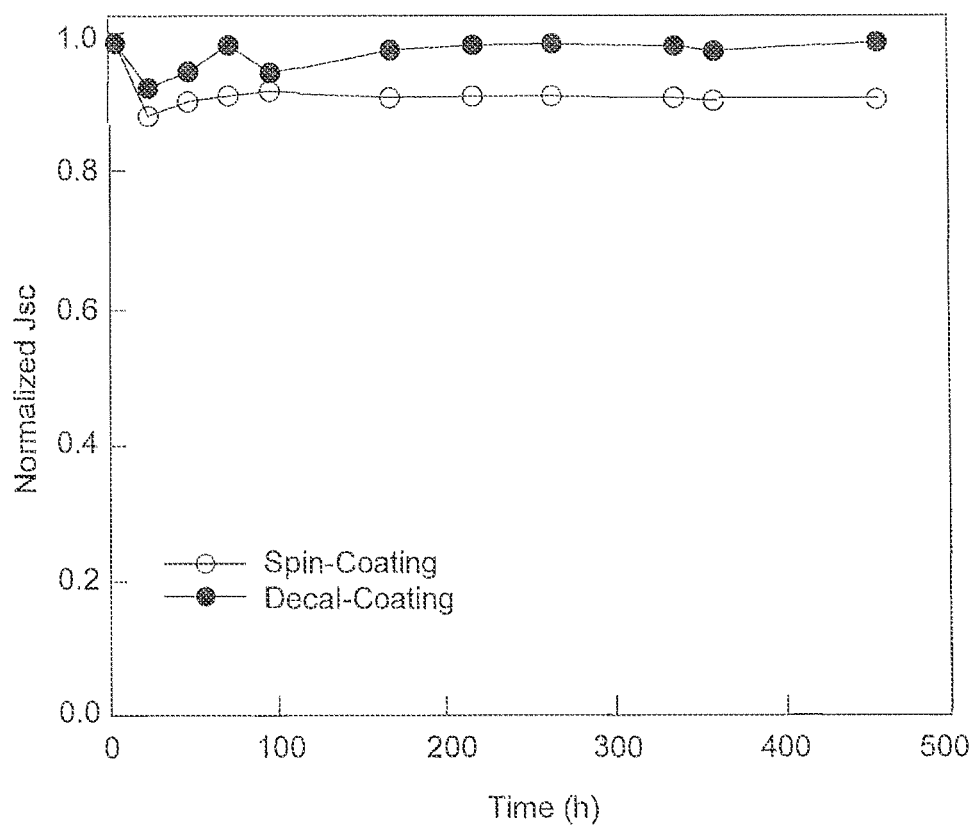
FIG. 10 is a graph showing short-circuit density with respect to driving stability for 500 h in the atmosphere in organic optoelectronic devices according to the example and comparative example of the present disclosure.
Figure 11:
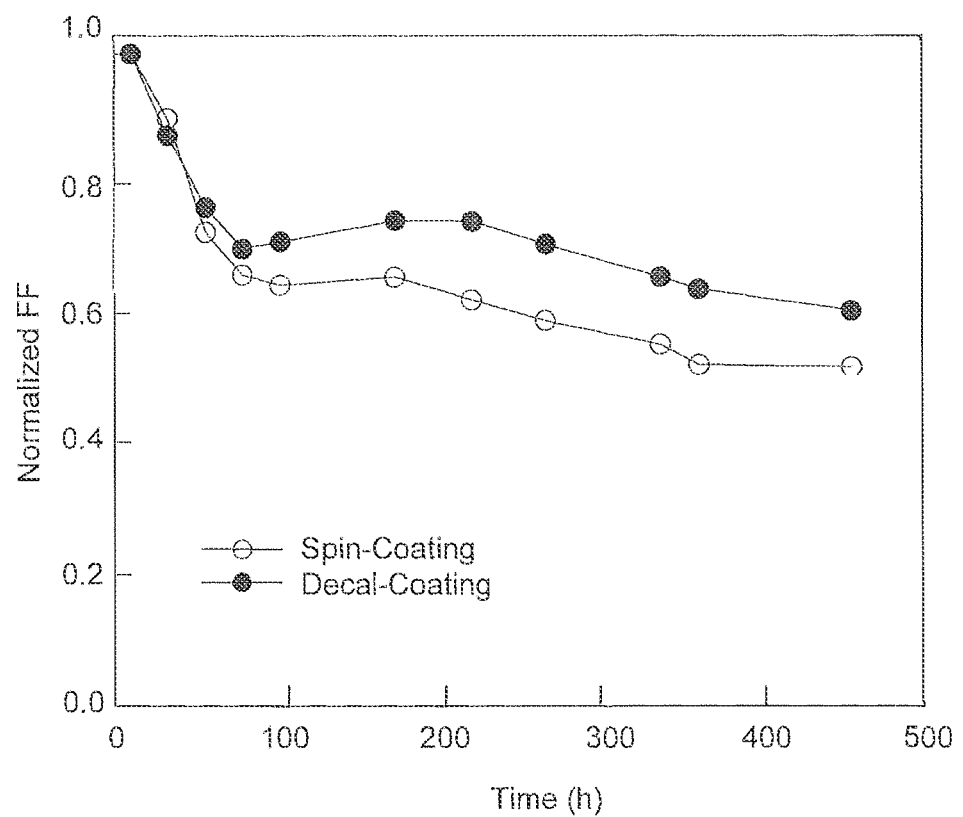
FIG. 11 is a graph showing a fill factor with respect to driving stability for 500 h in the atmosphere in organic optoelectronic devices according to the example and comparative example of the present disclosure.
Figure 12:
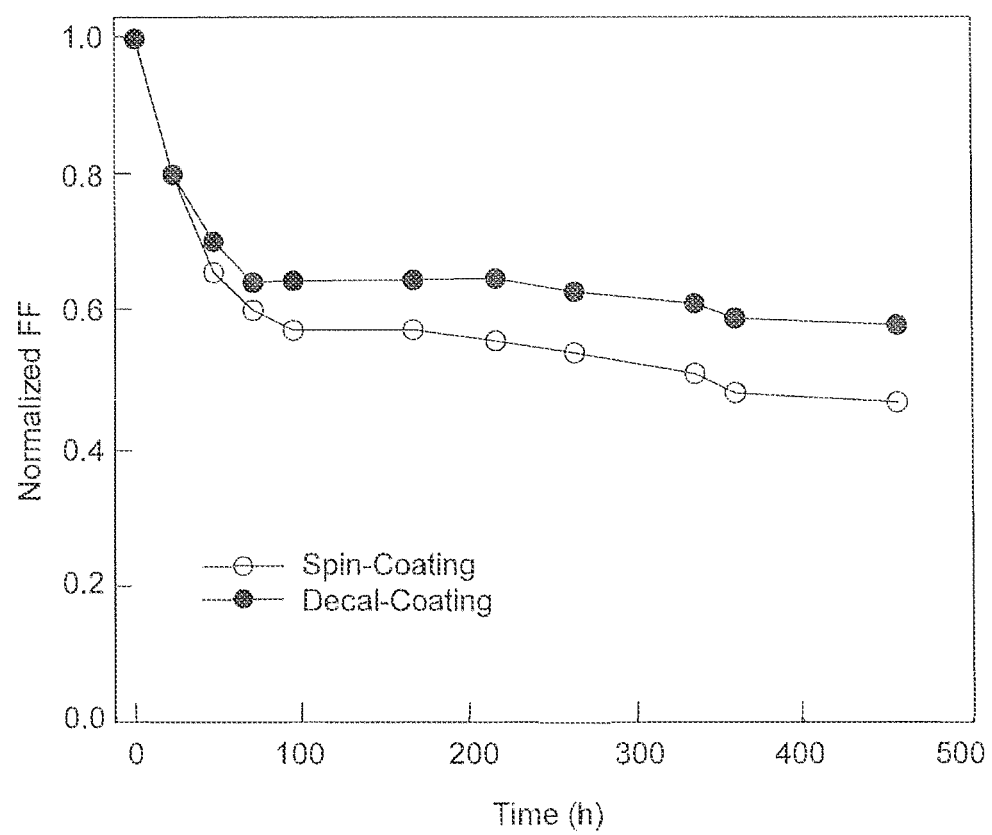
FIG. 12 is a graph showing photo-conversion efficiency with respect to driving stability for 500 h in the atmosphere in organic optoelectronic devices according to the example and comparative example of the present disclosure.

Referring to FIGS. 9 and 12, the optoelectronic device of the example was improved compared with the comparative example in terms of open-circuit voltage, short-circuit density, a fill factor, and photo-conversion efficiency with respect to driving stability for 500 h.

Referring to FIG. 13, the photosensitive layer thin film of the example formed on the PEDOT:PSS layer showed improved root mean square (RMS) roughness values immediately after manufacturing and after 7 days in the atmosphere compared with the comparative example, and thus the layer of the example had a flat surface condition. It was also identified that the photosensitive layer thin film of the example maintained a flat surface condition even over time in the atmosphere.

What is claimed is:

1. A method for manufacturing an organic optoelectronic device, the method comprising:
   coating a second layer composition on a mediator; and
   forming a second layer of thin film on a first layer by moving the second layer composition coated on the mediator onto the first layer,
   wherein the second layer composition contains a donor and an acceptor and the acceptor includes a non-fullerene compound,
   wherein when a bottom portion and a top portion are separated in the second layer of thin film formed on the first layer, the bottom portion being in contact with the first layer and the top portion being not in contact with the first layer, the acceptor is more abundant than the donor in the top portion and the donor is more abundant than the acceptor in the bottom portion.

2. The method of claim 1, wherein the acceptor includes a non-fullerene compound containing a fluoro group.

3. The method of claim 1, wherein the donor includes a compound containing a fluoro group.

4. The method of claim 1, further comprising, after the forming of the second layer of thin film on the first layer, forming a third layer of thin film on the second layer.

5. The method of claim 4, wherein the third layer of thin film contains titanium oxide ($TiO_x$, $1 \leq x \leq 10$).

6. The method of claim 1, wherein the first layer contains poly(3,4-ethylenediocy-thiophene) doped with poly(styrenesulfonic acid (PEDOT:PSS).

7. The method of claim 1, wherein the acceptor of the second layer composition is 2,2'-[[4,4,9,9-tetrakis(4-hexylphenyl)-4,9-dihydro-s-indaceno[1,2-b:5,6-b']dithiophene-2,7-diyl]bis[[4-[(2-ethylhexyl)oxy]-5,2-thiophenediyl]

methylidyne(5,6-difluoro-3-oxo-1H-indene-2,1(3H)-diylidene)]]bis[propanedinitrile] (IEICO-4F).

8. The method of claim 1, wherein the donor of the second layer composition is poly([2,6'-4,8-di(5-ethylhexylthienyl)benzo[1,2-b;3,3-b]dithiophene]{3-fluoro-2 [(2-ethylhexyl)carbonyl]thieno[3,4-b]thiophenediyl} (PTB7-Th).

9. The method of claim 1, wherein the root mean square (RMS) roughness of the second layer of thin film formed on the first layer is 0.1 to 3.0 nm.

10. A method for manufacturing an organic optoelectronic device, the method comprising:
   coating a second layer composition on a mediator; and forming a second layer of thin film on a first layer by moving the second layer composition coated on the mediator onto the first layer, wherein the second layer composition contains a donor and an acceptor and the acceptor includes a non-fullerene compound,
   further comprising, before the coating of the second layer composition on the mediator, preparing a mediator containing a polyurethane acrylate oligomer,
   wherein in the preparation of the mediator, a chemical agent containing a hydroxy, carboxy, or fluoro group is further added to the mediator such that $w<-1$ is satisfied when the interfacial energy difference between the mediator and the second layer is denoted as A, the interfacial energy difference between the second layer and the first layer is denoted as B, the interfacial energy difference between the mediator and the first layer is denoted as C, and a value of $(A-B)/C$ is denoted as w.

* * * * *